United States Patent
Haim et al.

(10) Patent No.: US 7,684,524 B2
(45) Date of Patent: Mar. 23, 2010

(54) ENHANCED AUTOMATIC GAIN CONTROL MECHANISM FOR TIME-SLOTTED DATA TRANSMISSIONS

(75) Inventors: John W. Haim, Baldwin, NY (US); Fryderyk Tyra, Huntington Station, NY (US); Louis J. Guccione, East Chester, NY (US); Timothy A. Axness, Collegeville, PA (US); Donald M. Grieco, Manhassett, NY (US)

(73) Assignee: InterDigital Technology Corporation, Wilmington, DE (US)

(*) Notice: Subject to any disclaimer, the term of this patent is extended or adjusted under 35 U.S.C. 154(b) by 1305 days.

(21) Appl. No.: 10/799,951

(22) Filed: Mar. 12, 2004

(65) Prior Publication Data

US 2004/0242172 A1 Dec. 2, 2004

Related U.S. Application Data

(60) Provisional application No. 60/454,894, filed on Mar. 14, 2003.

(51) Int. Cl.
*H03G 3/20* (2006.01)
(52) U.S. Cl. .................. 375/345; 455/136; 455/138
(58) Field of Classification Search .............. 374/345; 455/127.2, 234.1, 136, 138, 219, 232.1, 239.1, 455/240.1, 245.1, 226.1, 226.2; 341/139
See application file for complete search history.

(56) References Cited

U.S. PATENT DOCUMENTS

| | | | | |
|---|---|---|---|---|
| 5,353,305 A | * | 10/1994 | Fukuda et al. | ............... 375/231 |
| 5,457,813 A | | 10/1995 | Poutanen | |
| 5,548,594 A | | 8/1996 | Nakamura | |
| 5,623,521 A | * | 4/1997 | Yaguchi et al. | ............. 375/345 |
| 5,898,535 A | * | 4/1999 | Kawai | ...................... 360/77.02 |

(Continued)

FOREIGN PATENT DOCUMENTS

EP 1175004 1/2002

(Continued)

OTHER PUBLICATIONS

Tsurumi et al. "System-Level Compensation Approach to Overcome Signal Saturation, DC Offset, and $2^{nd.}$ Order Nonlinear Distortion in Linear Direct Conversion Receiver." IEICE Transactions on Electronics, Electronics Society, vol. E82-C, No. 5, May 1999, pp. 708-715.

*Primary Examiner*—Chieh M Fan
*Assistant Examiner*—Aristocratis Fotakis
(74) *Attorney, Agent, or Firm*—Volpe and Koenig, P.C.

(57) ABSTRACT

An automatic gain control (AGC) method according to the present invention applies an initial gain by a digital AGC circuit in a timeslot is determined using a final calculated gain from the same timeslot in the previous frame together with an offset factor. An erase function is activated for a given data sample block when the number of saturated data samples that are detected within the block exceeds a threshold value. The power measurement made by the AGC circuit and used to update the gain is adjusted based on the number of measured data samples that are saturated. These elements provide a gain limiting function and allows limiting of the dynamic range for further signal processing.

12 Claims, 3 Drawing Sheets

U.S. PATENT DOCUMENTS

| | | | |
|---|---|---|---|
| 6,160,443 A | 12/2000 | Maalej et al. | |
| 6,314,278 B1 | 11/2001 | Zamat | |
| 6,459,397 B1 | 10/2002 | Olgaard et al. | |
| 6,510,188 B1* | 1/2003 | Isaksen et al. | 375/345 |
| 6,556,635 B1* | 4/2003 | Dehghan | 375/345 |
| 6,591,089 B1* | 7/2003 | Ichihara | 455/115.3 |
| 6,721,547 B2* | 4/2004 | Husted et al. | 455/226.1 |
| 6,735,422 B1* | 5/2004 | Baldwin et al. | 455/232.1 |
| 6,748,200 B1* | 6/2004 | Webster et al. | 455/234.1 |
| 6,781,981 B1* | 8/2004 | Kimbrough | 370/352 |
| 6,843,597 B1* | 1/2005 | Li et al. | 375/345 |
| 7,046,976 B2* | 5/2006 | Le Naour et al. | 455/240.1 |
| 7,068,987 B2* | 6/2006 | Baldwin et al. | 455/232.1 |
| 2001/0048727 A1 | 12/2001 | Schmutz et al. | |
| 2002/0042256 A1* | 4/2002 | Baldwin et al. | 455/232.1 |
| 2002/0048267 A1 | 4/2002 | Jacques et al. | |
| 2003/0026363 A1 | 2/2003 | Stoter et al. | |
| 2003/0091132 A1 | 5/2003 | Anderson | |
| 2003/0103604 A1* | 6/2003 | Kato et al. | 379/68 |
| 2003/0139160 A1* | 7/2003 | Yang | 455/226.1 |
| 2004/0151264 A1* | 8/2004 | Montojo et al. | 375/345 |
| 2004/0156457 A1* | 8/2004 | Alexander | 375/346 |
| 2005/0018644 A1* | 1/2005 | Gessner et al. | 370/349 |
| 2006/0014507 A1* | 1/2006 | Giancola et al. | 455/232.1 |

FOREIGN PATENT DOCUMENTS

| | | |
|---|---|---|
| GB | 2369258 | 5/2002 |
| JP | S58-43639 | 3/1983 |
| JP | 2001-136036 | 5/2001 |
| JP | 2001-168662 | 6/2001 |
| WO | 02/32018 | 4/2002 |
| WO | 02/43253 | 5/2002 |

* cited by examiner

ENHANCED AUTOMATIC GAIN CONTROL MECHANISM FOR TIME-SLOTTED DATA TRANSMISSIONS

CROSS REFERENCE TO RELATED APPLICATION

This application claims priority from U.S. provisional application No. 60/454,894 filed on Mar. 14, 2003, which is incorporated by reference as if fully set forth.

FIELD OF INVENTION

The present invention generally relates to wireless communication systems. More particularly, the present invention relates to an automatic gain control (AGC) circuit for a timeslotted communication system, such as a time division duplex (TDD), time division multiple access (TDMA) or time division-code division multiple access (TD-CDMA) system.

BACKGROUND

In a conventional wireless communication system, the baseband signal at the receiver is converted from an analog format into a digital format so that the useful information in the signal can be recovered via a sequence of digital processes. Typically, an analog-to-digital converter (ADC) is used to achieve this conversion. In general, the more output bits the ADC has, the larger the dynamic range of the input signal the ADC can support. However, this results in a more expensive ADC, as well as higher costs for some of the other receiver components. Given the number of output bits, if the power of the input signal is too large, the output of the ADC may be saturated. On the other hand, if the power of the input signal is too small, the output of the ADC may be severely quantized. For both of these scenarios, the information expected to be recovered at the receiver may be degraded or lost.

A common approach for solving this problem is to apply a dynamically adjustable gain amplifier in front of the ADC so that the input signal of the ADC can be maintained within desired limits. Typically, the adjustable gain is controlled using an AGC circuit.

It is well known in the art that power varies significantly between adjacent timeslots in a TDD frame and between the same time slot in adjacent frames due to variable data rates or a variable number of active users in a timeslot. In order to determine the correct gain level for a given timeslot, the AGC estimates the symbol power of the first N symbols in the timeslot as they are received. During this estimation process, the symbols may be lost for data estimation due to imperfect gain control during this time. Also, depending on the initial accuracy of the gain estimate, this estimation procedure may take a long time; accuracy in this case is the difference between the gain applied at the start of the timeslot and the final "correct" gain as determined by the AGC circuit.

A typical TDD frame generally comprises fifteen timeslots. Each of the timeslots includes two data bursts that are separated by a midamble, followed by a guard period at the end of the timeslot. The data bursts transmit the desired data, and the midamble is used to perform channel estimation.

It would be desirable to have a system and method which avoids the accuracy and data loss problems of current AGC methods.

SUMMARY

According to the present invention, the initial gain applied by a digital AGC circuit in a timeslot is determined using a final calculated gain from the same timeslot in the previous frame together with an offset factor. An erase function is activated for a given data sample block when the number of saturated data samples that are detected within the block exceeds a threshold value. The power measurement made by the AGC circuit and used to update the gain is adjusted based on the number of measured data samples that are saturated. These elements provide a gain limiting function and allows limiting of the dynamic range for further signal processing.

DETAILED DESCRIPTION OF THE PREFERRED EMBODIMENT(S)

Figure 1:
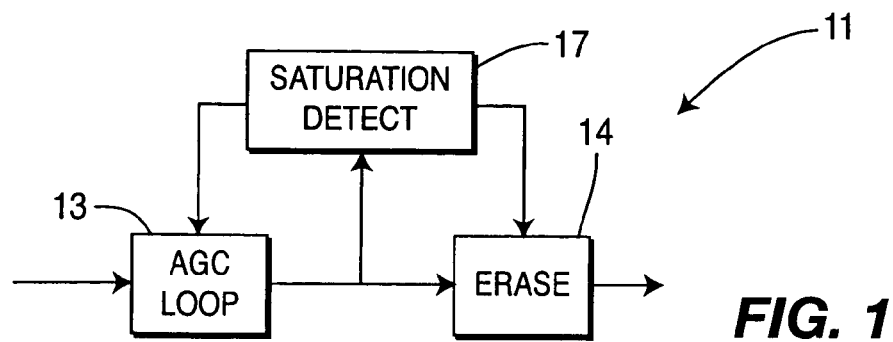
FIG. 1 is a general block diagram of an automatic gain control (AGC) circuit made in accordance with the present invention.

The present invention will be described with reference to the drawing figures wherein like numerals represent like elements throughout.

The present invention is useful in wireless communications, such as in conjunction with a third generation partnership program (3GPP) system utilizing the time division duplex mode. It is noted, however, that the present invention is applicable to any wireless communication system. Such systems use base stations (BS) and wireless transmit/receive units (WTRUs). A WTRU includes, but is not limited to a user equipment, mobile station, fixed or mobile subscriber unit, pager, or any other type of device capable of operating in a wireless environment. A base station includes, but is not limited to, a Node B, site controller, access point or other interfacing device in a wireless environment. While CDMA under the 3GPP protocol is described in connection with exemplary embodiments, the invention has general applicability to other wireless or wired, and timeslotted or non-timeslotted communication systems.

Figure 4:
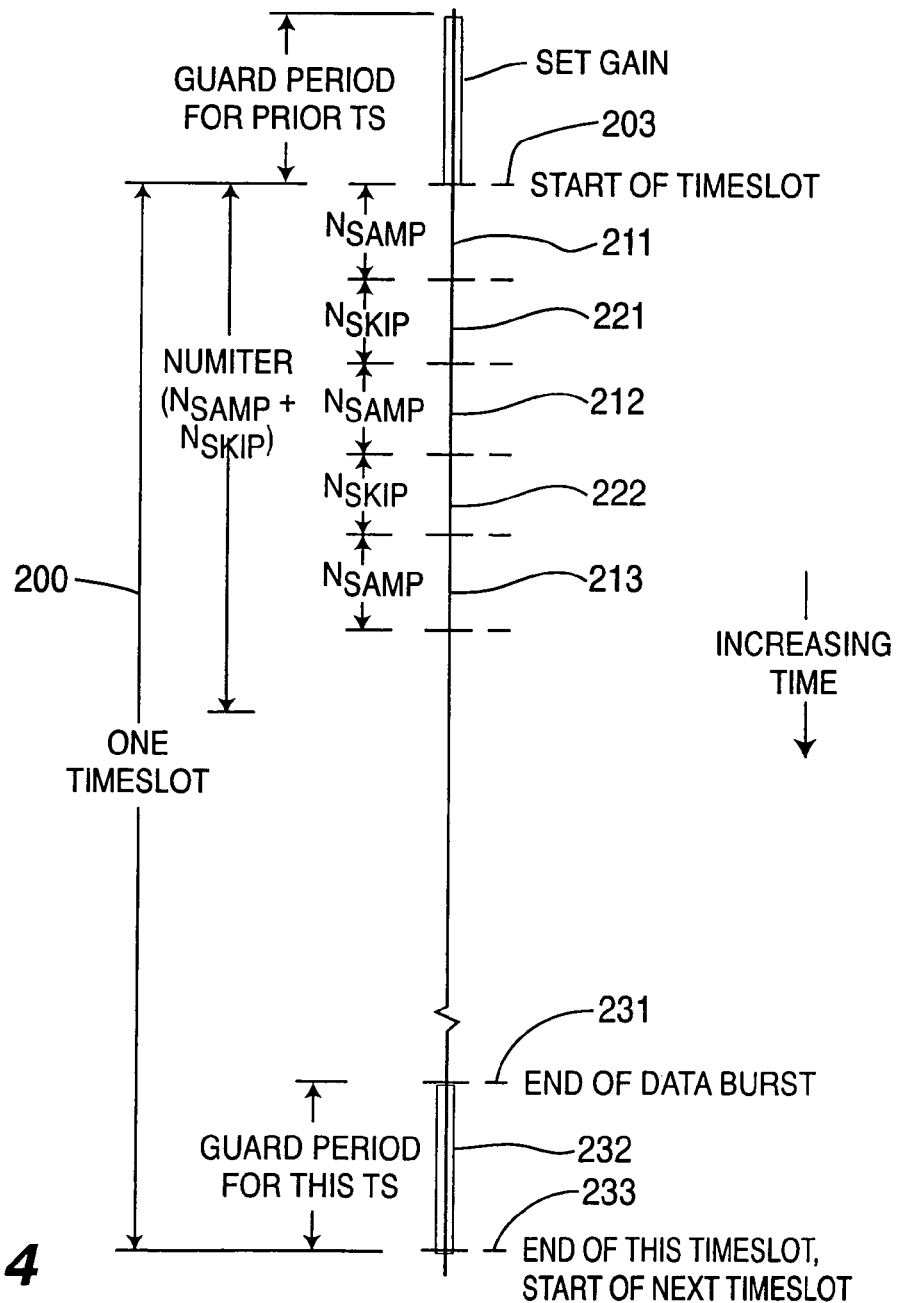
FIG. 4 is a timing diagram of the sequence of events within a timeslot.

In accordance with the present invention, the following assumptions are made. First, the cell search process has been completed successfully and the timeslot timing has been acquired. Second, the cell search AGC provides the initial value of gain to be used for the first time slot, (i.e., the Broadcast Channel (BCH) timeslot) that is demodulated after cell search has successfully completed. Third, the total gain of the RF chain has been applied to the received signal and is reflected in the values of the signal at the input of the digital controlled gain block The AGC process in accordance with the present invention is timeslot-based. Referring to FIG. 4, a timing diagram is shown. For each timeslot 200, there is a start of the timeslot 203, and a plurality of sampling periods $N_{SAMP}$ 211-213, separated by a plurality of skip periods $N_{SKIP}$ 221, 222. The end of the data burst 231 is followed by a guard period 232, which is adjacent to the end 233 of the timeslot 200. Generally, for each timeslot 200, the digitally controlled gain is initialized, followed by a plurality of adjustments so that the power at the output of ADC becomes close to a reference power level A block diagram of the AGC unit 11 made in accordance with the present invention is shown in FIG. 1. The AGC unit 11 includes an AGC loop 13, an erase function module 14, and a saturation detection circuit 17. An input signal is received by the AGC loop 13, which processes the input signal and outputs to the erase function module 14 and the saturation detection circuit 17. The saturation detection circuit 17, receives the output from the AGC loop 13 and provides its output to both the AGC loop 13 and to the erase function module 14. The erase function module 14 in turn provides its output to subsequent receiver processes.

In operation, the AGC loop 13 samples an input signal and processes the signal to provide an output to the saturation detection circuit 17 and to the erase function module 14. The AGC loop 13 determines the proper AGC level, utilizing an input from the saturation detection circuit 17. The saturation detection circuit 17 provides a count of the number of samples within a sample block ($N_{SAMP}$) that are saturated. If the number of saturated samples within the sample block ($N_{SAMP}$) exceeds a predetermined threshold, the erase function module 14 replaces all of the samples within an extended block ($N_{SAMP}+N_{SKIP}$) with zeros. The saturation count is also used by AGC circuit 11 to compensate for the overestimation of the required gain, due to the presence of saturated samples.

The output for the AGC circuit 11 comprises digital data samples from the I and Q channels for subsequent receiver processes.

The frequency of operation of the AGC circuit 11 is determined by a need to effect processing for the signals which are received in each timeslot. Therefore the frequency of operation is such that the AGC operates on each active received timeslot.

Figure 2:
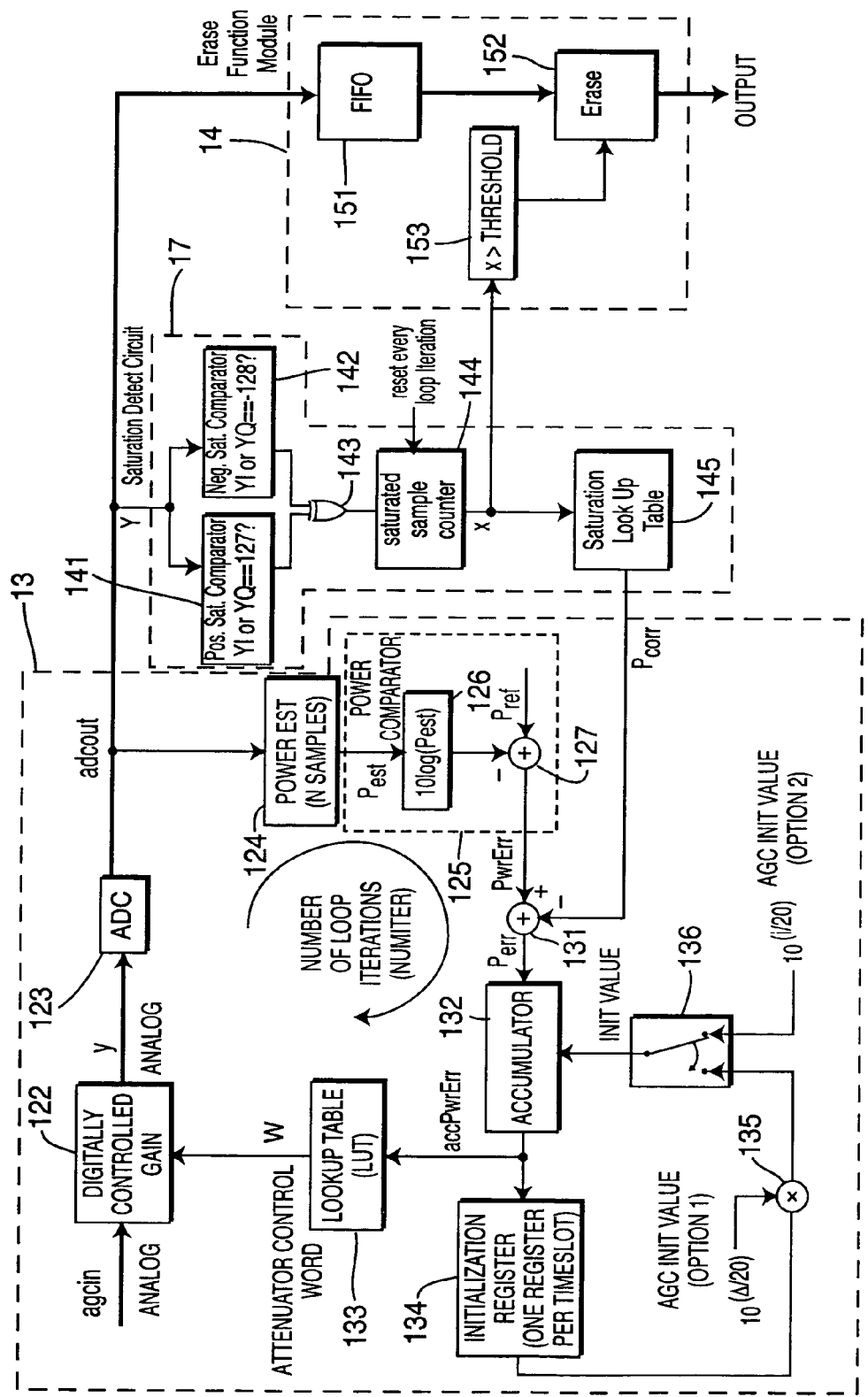
FIG. 2 is a block diagram of an AGC circuit constructed in accordance with the present invention.

Referring now to FIG. 2, there is shown a detailed block diagram of a circuit 100 for executing the enhanced AGC process of the present invention. The circuit 100 includes the AGC loop 13, the erase function module 14, and the saturation detection module 17.

The AGC loop 13 includes a digitally controlled gain circuit 122, an ADC 123, a power estimator 124, a power comparator 125, a summer 131, an accumulator 132, a control word look-up table (LUT) 133, an initialization register 134, a multiplier 135, and an initial value selector 136.

The digitally controlled gain circuit 122 receives an input analog signal (agcin) and processes the analog signal to provide a gain-controlled analog input (y) to the ADC 123. The ADC provides a digital sample output (adcSampout). The digital sample output (adcSampout) is provided to the saturation detection circuit 17, the erase function module 14 and the power estimation circuit 124.

The power estimation circuit 124 estimates the power of the digital sample output (adcSampout) and provides this estimate to the power comparator 125.

The power comparator 125 preferably includes a log estimator 126. Using a log function linearizes the AGC loop in dB, providing loop response faster than what would be achieved without the log function. The power estimate $P_{est}$ of the log estimator 126 is input to a summer 127 which compares the power estimate $P_{est}$ of the log estimator 126 with a power reference ($P_{ref}$). The output from summer 127 is an error signal (pwrErr) that indicates the power setting error. This is calculated as follows:

$$pwrErr = 10 \cdot \log_{10}\left(\frac{P_{ref}}{P_{est}}\right) \qquad \text{Equation (1)}$$

The power setting error pwrErr output from the summer 127 is input into a second summer 131, which adjusts the power setting error pwrErr by a correction factor $P_{corr}$. As will be explained in detail hereinafter with reference to the saturation detection circuit 17, the correction factor $P_{corr}$ depends on the saturation count.

The summer 131 uses the following inputs to calculate a power error signal $P_{err}$: 1) the power setting error pwrErr from the power comparator circuit 125; and 2) a power correction value $P_{corr}$ from a saturation LUT 145. The output of the summer 131 is a power error signal $P_{err}$ which includes saturation level adjustment. It is calculated as follows:

$$P_{err} = pwrErr - P_{corr} \qquad \text{Equation (2)}$$

The purpose of the power error signal $P_{err}$ is to compensate for the overestimation of the gain due to underestimating the received power because of saturations. The power error signal $P_{err}$ is then input to the accumulator 132.

The accumulator 132 accumulates the power error signal $P_{err}$ and provides its output accPwrErr to the control word LUT 133 and to the initialization register 124.

The control word LUT 133 provides a gain control word (W) to the digitally controlled gain circuit 122 that corresponds to the desired gain setting determined in the current iteration. In one preferred embodiment, the gain setting is in steps of 1 dB for a total range of 0 to 75 dB, although this is just one example of such a setting. The input of the LUT 133 is the accumulated error signal accPwrErr from the accumulator 132. The output of the LUT 133 is the gain control word (W) which adjusts the digitally controlled gain circuit 122 to achieve the desired gain setting.

The output accPwrErr of the accumulator 132 is also provided to the initialization register 134. The operation of the AGC loop 13 requires storage of the accumulator 132 values at the end of each timeslot. These values are stored in the initialization register 134. There is one initialization register 134 for each timeslot. The output of the initialization register 134 is multiplied by a factor of $10^{\Delta/20}$ using multiplier 135, (where $\Delta$ is a pre-programmed offset factor), to provide a first input (option 1) to the initial value selector 136. The first input is a preferred embodiment of the present invention whereby the accumulator value of a timeslot in the previous frame stored in the initialization register 134 is used along with the offset factor $\Delta$, to calculate the initial gain applied in the current timeslot. An example range for the offset factor $\Delta$ is from 0 to −20 dB in 1 dB steps.

A second input (option 2) to the initial value selector 136 is a predetermined value. An example range for this value is from 0 to −75 dB in 1 dB steps.

The switching circuit 136 selects between the first and second inputs to provide an initialization value to the accumulator 132. The selection of an initial value via the selector 136 is accomplished with a gain initialization indication. If gain initialization option 1 is indicated, the initial gain is the final calculated gain from the previous frame for the current timeslot adjusted by the offset factor $\Delta$. If gain initialization option 2 is indicated, the initial gain is a predetermined fixed value, $\iota$, which is applied to the accumulator as $10^{\iota/20}$. An example range for ι is 0 to −75 dB, although the specific value is dependent upon the implementation. After initialization, the accumulator 132 receives inputs, once per iteration, from the power comparator 125.

The signal from the ADC 123 (adcSampout) is also provided to the saturation detection circuit 17. The saturation detection circuit 17 compensates for under-valued power estimates due to saturated samples. The saturation detection circuit 17 includes a positive saturation comparator 141, a negative saturation comparator 142, an OR-gate 143, a saturated sample counter 144 and a saturation LUT 145. The saturated sample counter 144 provides outputs to both the saturation LUT 145 and to the erase function module 14.

The positive and negative saturation comparators 141, 142 detect saturated samples. In the comparators 141, 142, if both I and Q samples are saturated at the same time, it counts as a single saturated sample, not two saturated samples. The effect of OR-gate 143 is that either a negative or positive saturation counts as saturation. The saturated sample counter 144 counts the number of saturated samples in a given sample block ($N_{SAMP}$).

The saturation LUT 145 maps the number of saturated samples to power adjustment in order to compensate for the overestimation of gain due to the saturated samples. It should be noted that the reason that the gain is overestimated when there are saturated samples is that the saturated samples are clipped or reduced versions of what the true value would be if there were more ADC bits and the signal was not clipped.

The saturation detection circuit 17 provides protection to subsequent receiver processes for extreme cases of signal saturation, by triggering the erasing of samples. The saturation detection circuit 17 triggers the condition under which the erase function module 14 is activated for a given sample block ($N_{SAMP}+N_{SKIP}$). The condition is satisfied when the saturation count exceeds a predetermined threshold. Each given sample block ($N_{SAMP}+N_{SKIP}$) is handled separately. As the loop iterates, the probability of saturation drops considerably. Thus, as a practical matter, it is unlikely that any sample block ($N_{SAMP}+N_{SKIP}$) other than possibly the first one in the timeslot will trigger the erase function module 14.

Although the AGC design described hereinafter in one embodiment of the invention uses fixed-point settings derived from the basic assumption that the ADC word size is 8 bits (7 magnitude; 1 sign bit), it should be noted that the ADC word size is given by way of example and thus this particular ADC word size is not required.

In an exemplary embodiment, the saturation LUT 145 is required to provide a six-bit output as a function of the saturation counter 144. The LUT 145 has length equal to $N_{SAMP}$. It has an input (x) from the saturation sample counter 144 and an output of $P_{corr}$, the power error correction value.

In operation, the saturation detection circuit 17 receives the output from the ADC 123. Saturation detection is started by counting the number of samples output (adcSampout) from the signed 8-bit ADC that have values −128 or +127. The count is performed for every sample block ($N_{SAMP}+N_{SKIP}$) and it is reset for each iteration of the sample block. The number of saturated samples (x) in a sampling block $N_{SAMP}$ is used to form the estimate of the amount of saturation. If either the I or Q parts of a given input value is −128 or +127, the saturation counter 143 is incremented.

The number of saturated samples (x) that occurred within the sampling block $N_{SAMP}$, is then output to the saturation LUT 145 and the erase function module 14.

Based on the number of saturated samples (x) during a sampling block $N_{SAMP}$, the power error correction value $P_{corr}$ is output from the saturation LUT 145. This value is an estimate of, and is proportional to, the amount of saturation that has occurred.

As described hereinbefore, this value is subtracted from the output of the power comparator block 125. The power error correction value $P_{corr}$ is based on the same sampling block ($N_{SAMP}$) as the power estimate $P_{est}$, making the pair fully synchronized. Because the power estimates are preferably in logarithmic form, they allow for a smaller word size of the contents of the saturation LUT 145.

The output of the ADC 123 is also provided to the erase function module 14. The erase function module 14 includes a FIFO 151, an erase circuit 152 and a compare circuit 153.

The erase function module 14 makes the decision to erase data samples, (i.e., I and Q samples are set to zero), based on the number of saturated samples (x) from the saturation detection circuit 17. When the number of saturated samples (x) exceeds a predetermined threshold, all of the samples in the corresponding sampling block ($N_{SAMP}+N_{SKIP}$) for a given loop iteration are erased.

FIFO 151 must be appropriately sized, since the sampling block $N_{SAMP}$ must be received before a decision can be made, and the number of saturated samples (x) is being counted during the sampling block $N_{SAMP}$.

The output from the erase function module 14 is the received data with some of the samples set to zero (erased).

Figure 3:
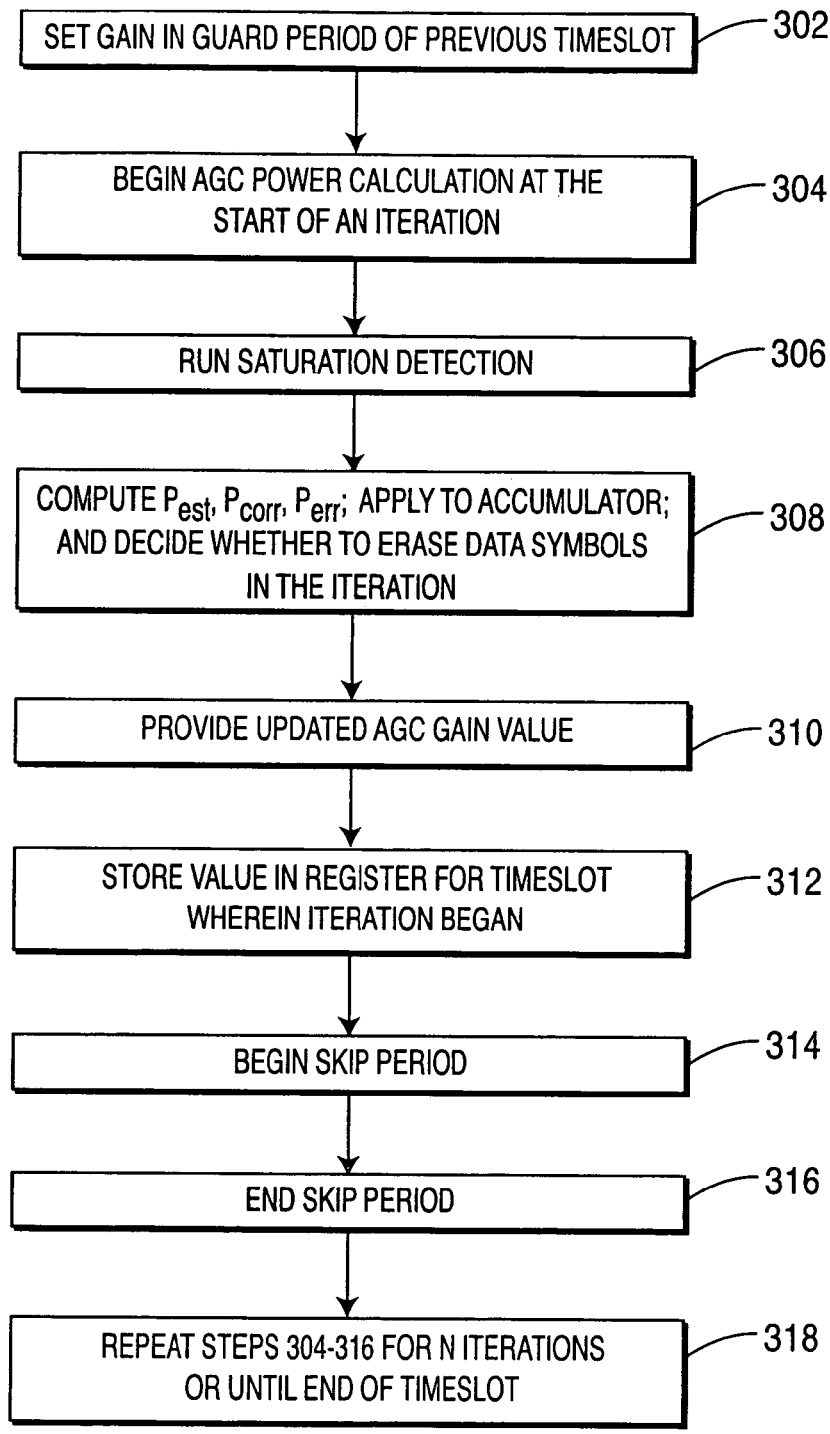
FIG. 3 is a flow diagram showing the AGC calculation performed in accordance with one embodiment of the present invention.

FIG. 3 is a flow diagram of a method 300 of AGC calculation performed in accordance with one embodiment of the present invention. In the guard period of the previous timeslot, the gain is set (step 302). It is noted that the gain may be set using option 1 or option 2. In option 1, the gain is the value stored in the register for the timeslot adjusted by the offset. In option 2, the gain is a fixed value. The selection of option 1 versus option 2 is pre-determined. Regardless of choosing option 1 or option 2, the initial AGC gain value is set before the start of the timeslot.

At the start of an iteration, an AGC power calculation begins (step 304). The start of an iteration is either at the beginning of a timeslot or immediately after the previous iteration in the timeslot. Saturation detection is run (step 306). This is followed by computing $P_{est}$, $P_{corr}$, $P_{err}$, and applying these values to the accumulator and the decision whether to erase the data symbols in the iteration is made (step 308). An updated AGC gain value is provided to the radio controller (step 310), and the value is stored in the register for the timeslot wherein the iteration began (step 312). A skip period begins (step 314) and then ends (step 316). This is repeated (steps 304-316) for N iterations or until the end of the timeslot (step 318).

What is claimed is:

1. A method for adjusting a setting of a gain control loop of a receiver with respect to a selected timeslot of time frame format, the method comprising:

processing a first plurality of samples of a data signal received in the selected timeslot of a current time frame with an initial gain factor;

determining, from the first plurality of samples, a first number of the first samples which exceed a saturation criteria;

comparing the first number to a threshold number and erasing the first plurality of samples on a condition that the first number is greater than the threshold number;

processing a second plurality of samples of the data signal received in the selected timeslot of the current time frame that are processed with a gain factor adjusted based, at least in part, upon the first number;

determining, from the second plurality of samples, a second number of the second samples which exceed the saturation criteria;

comparing the second number to the threshold number and erasing the second plurality of samples on a condition that the second number is greater than the threshold number; and processing a third plurality of samples of the data signal received in the selected timeslot of the current time frame that are processed with a gain factor adjusted based, at least in part, upon the second number.

2. The method of claim 1, processing a plurality of samples of the data signal received in the selected timeslot of the current time frame between processing the first plurality of samples and the second plurality of samples and processing a plurality of samples of the data signal received in the selected timeslot of the current time frame between processing the second plurality of samples and the third plurality of samples.

3. The method of claim 1, further comprising making gain factor adjustments using a power correction factor.

4. The method of claim 3, wherein the power correction factor depends, at least in part, upon a determined number of samples exceeding the saturation criteria.

5. The method of claim 4, further comprising a lookup table, which receives the determined number and outputs the power correction factor.

6. A receiver comprising:
a gain control loop configured to process samples of a data signal received with respect to a selected timeslot of a time frame including;
a gain control for applying a gain factor to samples of the data signal;
a saturation detection circuit configured to process samples from the gain control in selected groups to determine a number of samples within a group which exceed a saturation criteria;
a gain control adjustment circuit operatively associated with the gain control and the saturation detection circuit to adjust the gain factor applied by the gain control based in part on group saturation numbers determined by the saturation detection circuit while processing the data signal received with respect to the selected time slot of time frame such that:
an initial gain factor is applied to a first group of samples of the data signal received in the selected timeslot for which a first group saturation number is determined by the saturation detection circuit,
a gain factor adjusted based in part on the first group saturation number is applied to a second group of samples of the data signal received in the selected timeslot for which a second group saturation number is determined by the saturation detection circuit, and
a gain factor adjusted based in part on the second group saturation number is applied to a third group of samples of the data signal received in the selected timeslot; and
an erase circuit to compare the number of samples within a group of samples which exceed the saturation criteria to a threshold number and erase the group of samples on a condition that the number of samples within the group which exceed the saturation criteria is greater than the threshold number.

7. The receiver of claim 6 wherein the gain control loop is configured to process a plurality of samples of the data signal received in the selected timeslot between processing the first group of samples and the second group of samples and to process a plurality of samples of the data signal received in the selected timeslot between processing the second group of samples and the third group of samples.

8. The receiver of claim 6 wherein the gain control adjustment circuit is configured to make gain factor adjustments using a power correction factor.

9. The receiver of claim 6 wherein the gain control adjustment circuit is configured to make gain factor adjustments using a power correction factor that is based in part upon a group saturation number determined by the saturation detection circuit.

10. The receiver of claim 6 wherein the gain control adjustment circuit is configured to make gain factor adjustments using a power correction factor that is based in part upon a group saturation number determined by the saturation detection circuit by using a lookup table to receive the determined number and to output the power correction factor.

11. A wireless transmit receive unit (WTRU) comprising the receiver of claim 6.

12. A base station comprising the receiver of claim 6.

* * * * *